United States Patent
Suga et al.

(10) Patent No.: US 10,199,340 B2
(45) Date of Patent: Feb. 5, 2019

(54) SIGNAL TRANSMISSION INSULATIVE DEVICE AND POWER SEMICONDUCTOR MODULE

(71) Applicant: Mitsubishi Electric Corporation, Chiyoda-ku (JP)

(72) Inventors: Kenichi Suga, Chiyoda-ku (JP); Takao Tsurimoto, Chiyoda-ku (JP); Hiroki Shiota, Chiyoda-ku (JP); Kenichi Morokuma, Chiyoda-ku (JP); Shoichi Orita, Chiyoda-ku (JP); Fumitaka Tametani, Chiyoda-ku (JP); Takahiro Inoue, Chiyoda-ku (JP); Shiori Uota, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/509,126

(22) PCT Filed: Aug. 19, 2015

(86) PCT No.: PCT/JP2015/073229
§ 371 (c)(1),
(2) Date: Mar. 6, 2017

(87) PCT Pub. No.: WO2016/080034
PCT Pub. Date: May 26, 2016

(65) Prior Publication Data
US 2017/0278811 A1    Sep. 28, 2017

(30) Foreign Application Priority Data
Nov. 18, 2014 (JP) ................................ 2014-233376

(51) Int. Cl.
*H01L 23/64* (2006.01)
*H01F 27/32* (2006.01)
(Continued)

(52) U.S. Cl.
CPC .............. *H01L 24/03* (2013.01); *G11C 11/34* (2013.01); *H01F 27/2804* (2013.01);
(Continued)

(58) Field of Classification Search
CPC .... H01L 23/645; H01L 27/323; H01L 27/324
See application file for complete search history.

(56) References Cited

U.S. PATENT DOCUMENTS 5,070,317 A * 12/1991 Bhagat .................. B81B 7/0077
257/531
6,114,937 A *  9/2000 Burghartz ........... H01F 17/0006
336/200

(Continued)

FOREIGN PATENT DOCUMENTS

JP    2007-165343 A    6/2007
JP    2010-080774 A    4/2010

OTHER PUBLICATIONS

International Search Report dated Nov. 10, 2015, in PCT/JP2015/073229 filed Aug. 19, 2015.

*Primary Examiner* — David A Zarneke
(74) *Attorney, Agent, or Firm* — Oblon, McClelland, Maier & Neustadt, L.L.P.

(57) ABSTRACT

A signal transmission insulating device includes: a first coil; a second coil opposing the first coil to form a transformer together with the first coil; a first insulating film provided between the opposing first coil and second coil and made of a first dielectric material; a second insulating film surrounding the first coil and made of a second dielectric material having a lower resistivity or a higher permittivity than the first dielectric material; and a third insulating film surrounding the second coil and made of a third dielectric material having a lower resistivity or a higher permittivity than the first dielectric material.

11 Claims, 9 Drawing Sheets

(51) Int. Cl.
*H01L 23/00* (2006.01)
*G11C 11/34* (2006.01)
*H01L 23/373* (2006.01)
*H01L 25/16* (2006.01)
*H04L 1/00* (2006.01)
*H05K 7/14* (2006.01)
*H01F 27/28* (2006.01)
*H01L 23/62* (2006.01)
*H01L 25/18* (2006.01)

(52) U.S. Cl.
CPC ......... *H01F 27/32* (2013.01); *H01L 23/3738* (2013.01); *H01L 23/62* (2013.01); *H01L 23/645* (2013.01); *H01L 25/162* (2013.01); *H04L 1/0006* (2013.01); *H05K 7/1432* (2013.01); *H01F 2027/2809* (2013.01); *H01L 25/18* (2013.01)

(56) References Cited

U.S. PATENT DOCUMENTS

| | | | |
|---|---|---|---|
| 9,997,495 B2* | 6/2018 | Burger | H01L 23/48 |
| 2011/0175193 A1 | 7/2011 | Nakagawa | |
| 2013/0147023 A1* | 6/2013 | Lin | H01L 23/5225 257/659 |
| 2013/0168809 A1* | 7/2013 | Yen | H01L 23/5227 257/531 |

* cited by examiner

SIGNAL TRANSMISSION INSULATIVE DEVICE AND POWER SEMICONDUCTOR MODULE

TECHNICAL FIELD

The present invention relates to a signal transmission insulating device and a power semiconductor module including the signal transmission insulating device.

BACKGROUND ART

A conventional signal transmission insulating device having a thin film transformer structure is known in which a first insulating film is formed by forming a lower coil on the bottom of a recess provided on a semiconductor substrate, filling the recess with a liquid polyimide resin, and curing the liquid polyimide resin, an upper coil is formed on the first insulating film, and the thickness of the first insulating film is adjusted, thereby ensuring a desired insulation withstand voltage between the lower coil and the upper coil (see, e.g., Patent Document 1).

In such a signal transmission insulating device having a thin film transformer structure, when a voltage is applied to the upper coil and the lower coil, electric field concentration occurs at each corner of each of the upper coil and the lower coil. The signal transmission insulating device having a transformer structure has a plurality of corners, and insulation breakdown occurs from any of the corners of the upper coil or the lower coil when the applied voltage increases. Meanwhile, as in a signal transmission insulating device disclosed in Patent Document 2, in a signal transmission insulating device in which a second insulating film having a higher permittivity than a first insulating film is provided on a surface of a lower coil which surface faces an upper coil and the first insulating film and the upper coil are sequentially formed on the second insulating film, the second insulating film, which has a higher permittivity than the first insulating film, is formed at the lower coil side between the lower coil and the upper coil so as to be in contact with the lower coil. Thus, an electric field within the second insulating film becomes small, and electric field concentration at each corner of the lower coil, which is in contact with the second insulating film, can be alleviated.

CITATION LIST

Patent Document

Patent Document 1: Japanese Laid-Open Patent Publication No. 2007-165343

Patent Document 2: Japanese Laid-Open Patent Publication No. 2010-80774

SUMMARY OF THE INVENTION

Problems to be Solved by the Invention

Even in the above signal transmission insulating device having the second insulating film, however, when a voltage is applied to the upper and lower coils of the thin film transformer structure, electric field concentration at each corner of the lower coil is alleviated, but a sufficient effect of alleviating electric field concentration is not obtained, since the second insulating film is merely disposed on the surface of the lower coil which surface faces the upper coil. In addition, electric field concentration still occurs at each corner of the upper coil. Meanwhile, general, insulation breakdown starts from a location where an electric field concentrates and the insulation is weakest. Therefore, when the applied voltage increases, insulation breakdown occurs from the corner of the upper coil which is a weak-insulation location where an electric field concentrates, so that it is difficult to increase the insulation withstand voltage. For that reason, to ensure a predetermined withstand voltage, the thickness of the insulating film has to be increased more than necessary in consideration of electric field concentration at each corner of the upper coil. However, as a result of increasing the thickness of the insulating film more than necessary, the distance between the upper coil and the lower coil becomes long, so that there is a problem that transmission characteristics such as a signal transmission speed or a signal transmission intensity decrease.

The present invention has been made to solve the above-described problem, and an object of the present invention is to provide a signal transmission insulating device that can suppress a decrease in signal transmission characteristics and can increase a withstand voltage.

Solution to the Problems

A signal transmission insulating device according to the present invention includes:

a first coil;

a second coil opposing the first coil to form a transformer together with the first coil;

a first insulating film provided between the opposing first coil and second coil and made of a first dielectric material;

a second insulating film including a first film provided between the first insulating film and a surface in contact with a second principal surface of the first coil opposite to a first principal surface of the first coil which first principal surface faces the second coil, the first film filling and covering the first coil, the second insulating film including a second film provided on the surface in contact with the second principal surface and adjacently to the first film, the second insulating film being made of a second dielectric material having a lower resistivity than the first dielectric material; and a third insulating film including a third film provided between the first insulating film and a surface in contact with a third principal surface of the second coil which third principal surface faces the first coil, and a fourth film provided on the surface in contact with the third principal surface and adjacently to the third film, the fourth film filling and covering the second coil, the third insulating film being made of a third dielectric material having a lower resistivity than the first dielectric material.

Effect of the Invention

In the signal transmission insulating device according to the present invention, an electric field within the second insulating film and the third insulating film becomes small, since the first coil which is a lower coil is formed so as to be surrounded by the second insulating film having upper and lower surfaces formed to be flat, the second coil which is an upper coil is formed so as to be surrounded by the third insulating film having upper and lower surfaces formed to be flat, and the resistivity of each of the second insulating film and the third insulating film is lower than the resistivity of the first insulating film, or the permittivity of each of the second insulating film and the third insulating film is higher than the permittivity of the first insulating film. Thus, electric field concentration at each corner of the lower coil surrounded by the second insulating film and at each corner of the upper coil surrounded by the third insulating film can be alleviated. Accordingly, an insulation withstand voltage can be increased without increasing the thickness of the first insulating film, so that it is possible to increase the insulation withstand voltage and also suppress a decrease in signal transmission characteristics.

DESCRIPTION OF EMBODIMENTS

Embodiment 1

Figure 1:
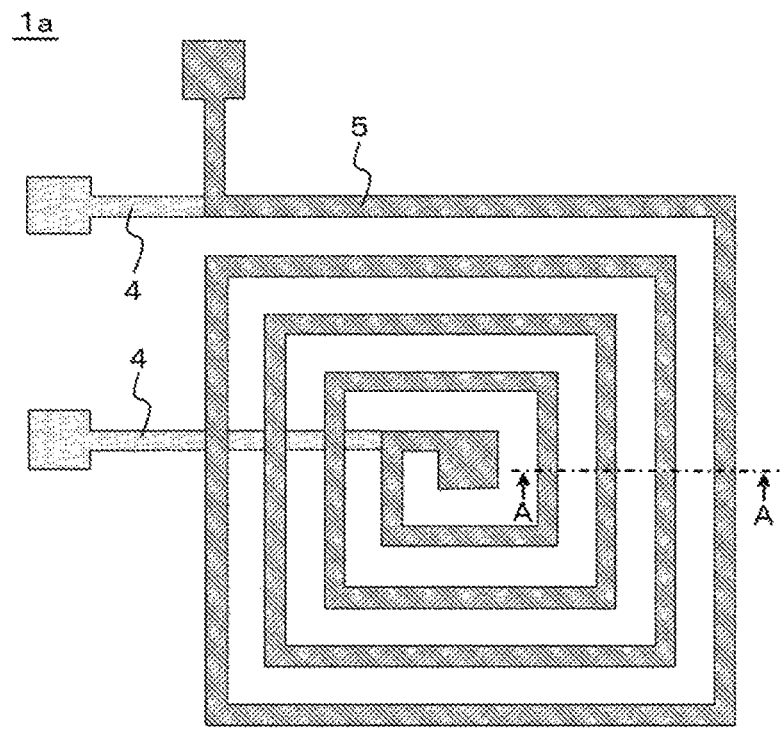
FIG. 1 is a plan view showing the configuration of a signal transmission insulating device according to Embodiment 1 of the present invention.
Figure 2:
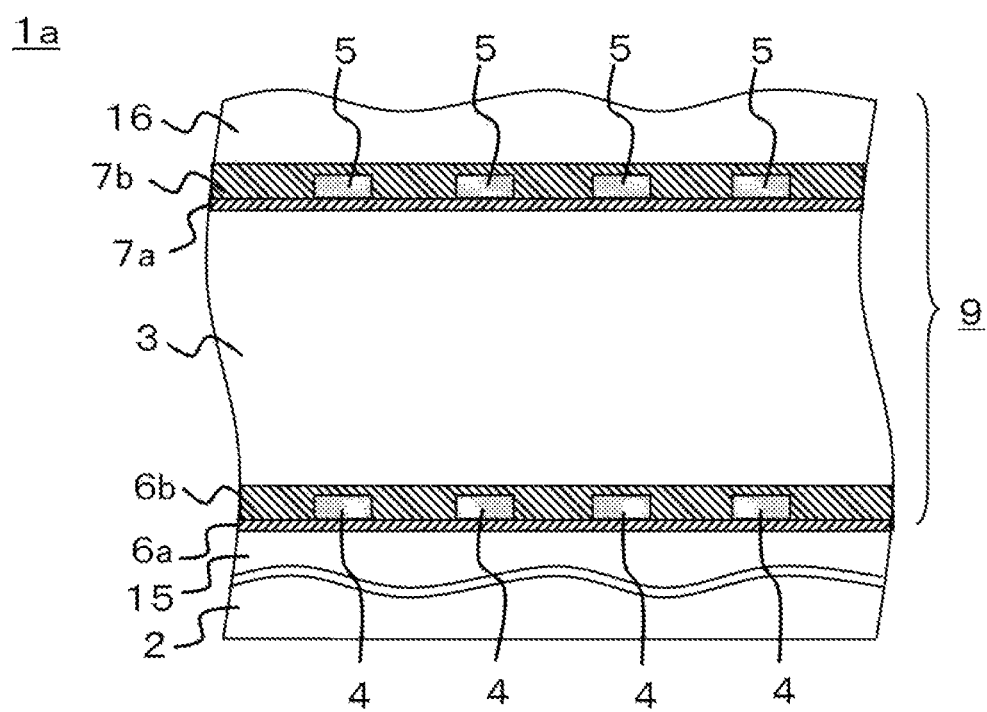
FIG. 2 is a cross-sectional view showing the configuration of the signal transmission insulating device according to Embodiment 1 of the present invention.

First, the configuration of a signal transmission insulating device according to Embodiment 1 of the present invention will be described. FIG. 1 is a plan view showing the configuration of the signal transmission insulating device 1a according to Embodiment 1 of the present invention. FIG. 2 is a cross-sectional view showing the configuration of the signal transmission insulating device 1a according to Embodiment 1 of the present invention. FIG. 2 corresponds to an A-A cross-sectional view in FIG. 1.

In FIG. 1, the signal transmission insulating device 1a includes a first coil 4 and a second coil 5 each obtained by winding a wire in a plurality of turns into a coil shape, and the first coil 4 and the second coil 5 oppose each other to form a transformer. In FIG. 1, a portion of the first coil 4 which portion overlaps the second coil 5 is not shown.

In FIG. 2, the signal transmission insulating device 1a has a structure in which a so-called thin film transformer structure 9 is formed on a semiconductor substrate 2 made of Si or the like. The thin film transformer structure 9 includes a lower insulating film 15, a second insulating film 6a, the first coil 4, a second insulating film 6b, a first insulating film 3, a third insulating film 7a, the second coil 5, a third insulating film 7b, and an upper insulating film 16. The lower insulating film 15 is formed on the semiconductor substrate 2, and the first coil 4 which is a lower coil is formed on the lower insulating film 15 so as to be surrounded by the second insulating films 6a and 6b. Furthermore, the second coil 5 which is an upper coil is formed on the second insulating film 6b, with the first insulating film 3 therebetween, so as to be surrounded by the third insulating films 7a and 7b, and the upper insulating film 16 is formed on the third insulating film 7b.

Each of the first insulating film 3, the lower insulating film 15, and the upper insulating film 16 is an insulating film composed of an $SiO_2$ (silicon oxide) film, and each of the second insulating films 6a and 6b and the third insulating films 7a and 7b is an insulating film composed of an SiN (silicon nitride) film having a lower resistivity than $SiO_2$. In addition, the first coil 4 and the second coil 5 are formed so as to oppose each other, the first coil 4 is formed so as to be surrounded by the second insulating films 6a and 6b, and similarly the second coil 5 is formed so as to be surrounded by the third insulating films 7a and 7b. Here, each space between coil portions of the adjacent turns of the first coil 4 is filled with a first film 6b constituting the second insulating film (hereinafter, referred to merely as second insulating film 6b), and the lower surface of a second film 6a constituting the second insulating film (hereinafter, referred to merely as second insulating film 6a) and the upper surface of the second insulating film 6b are formed to be flat, whereby an effect of alleviating electric field concentration at each corner of the first coil 4 can be enhanced. In addition, each space between coil portions of the adjacent turns of the second coil 5 is filled with a fourth film 7b constituting the third insulating film (hereinafter, referred to merely as third insulating film 7b), and the lower surface of a third film 7a constituting the third insulating film (hereinafter, referred to merely as third insulating film 7a) and the upper surface of the third insulating film 7b are formed to be flat, whereby an effect of alleviating electric field concentration at each corner of the second coil 5 can be enhanced.

Owing to the above configuration, it is possible to disperse mechanical stress (e.g., tensile stress, compressive stress, etc. The same applies hereinafter.) generated and applied to each film due to the differences in film stress or coefficient of thermal expansion between the second insulating film 6a and the lower insulating film 15, between the second insulating film 6b and the first insulating film 3, between the third insulating film 7a and the first insulating film 3, and between the third insulating film 7b and the upper insulating film 16. Thus, it is possible to suppress occurrence of a crack or the like to improve the reliability of insulation.

The above phrase "formed to be flat" means that, for example, in the case of the second insulating film 6b, the upper surface of the second insulating film 6b forms, over its entirety, a flat surface parallel to the lower surface of the second insulating film 6a, and does not form an uneven surface regardless of whether a portion of the upper surface of the second insulating film 6b is directly above the first coil 4 (the same applies hereinafter). The relationship between the upper surface of the third insulating film 7b and the lower surface of the third insulating film 7a is the same as the relationship between the upper surface of the second insulating film 6b and the lower surface of the second insulating film 6a (the same applies hereinafter).

In the present embodiment, $SiO_2$ is used for the first insulating film 3, the lower insulating film 15, and the upper insulating film 16. However, the materials of the first insulating film 3, the lower insulating film 15, and the upper insulating film 16 are not limited thereto, another material such as polyimide or parylene may be used for each of the first insulating film 3, the lower insulating film 15, and the upper insulating film 16, and the materials of the first insulating film 3, the lower insulating film 15, and the upper insulating film 16 may be the same or different from each other. In addition, SiN is used for the second insulating films 6a and 6b and the third insulating films 7a and 7b. However, another insulating material having a lower resistivity than the dielectric material used for the first insulating film 3 may be used for each of the second insulating films 6a and 6b and the third insulating films 7a and 7b, and the materials of the second insulating films 6a and 6b and the third insulating films 7a and 7b may be the same or different from each other.

Next, a manufacturing method for the signal transmission insulating device 1a according to Embodiment 1 of the present invention will be described. FIG. 3A,3B,3C,3D are cross-sectional views showing a manufacturing flow for the signal transmission insulating device 1a according to Embodiment 1 of the present invention.

Figure 3A:
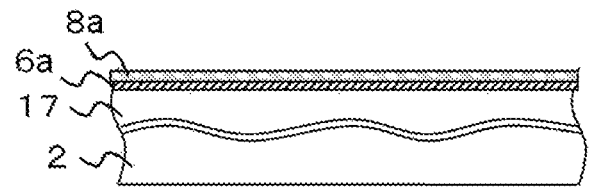
FIG. 3A, 3B, 3C, 3D are cross-sectional views showing a manufacturing flow for the signal transmission insulating device according to Embodiment 1 of the present invention.

In FIG. 3A, an insulating film 17 which is to be the lower insulating film 15 made of $SiO_2$ is formed by a CVD (Chemical Vapor Deposition) method on the semiconductor substrate 2 made of Si or the like, and the second insulating film 6a is formed on the insulating film 17 by using SiN. A metal film 8a made of aluminum or the like is formed on the second insulating film 6a by a sputtering deposition method.

Figure 3B:
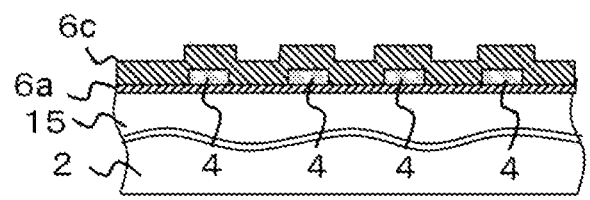

In FIG. 3B, the metal film 8a is etched to form the first coil 4. Then, an insulating film 6c made of SiN is initially formed by a CVD method between the coil portions of the adjacent turns of the first coil 4 and on the surface of the first coil 4 which surface faces the second coil 5, so as to surround the first coil 4.

Figure 3C:
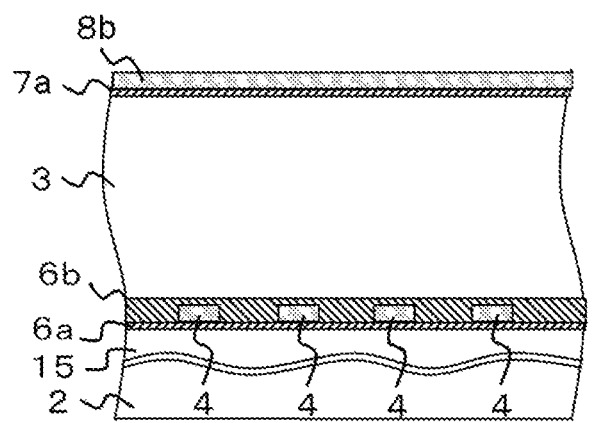

In FIG. 3C, the upper surface of the previously formed second insulating film 6c (see FIG. 3B) is polished to be flat by a CMP (Chemical Mechanical Polish) method to form the second insulating film 6b, and the first insulating film 3 having a flat upper surface is formed on the second insulating film 6b.

Through the above procedure, preparations for forming the flat third insulating film 7a on the first insulating film 3 are made. Thus, subsequently, the third insulating film 7a made of SiN is formed on the first insulating film 3, and a metal film 8b is formed on the third insulating film 7a by a sputtering deposition method.

Figure 3D:
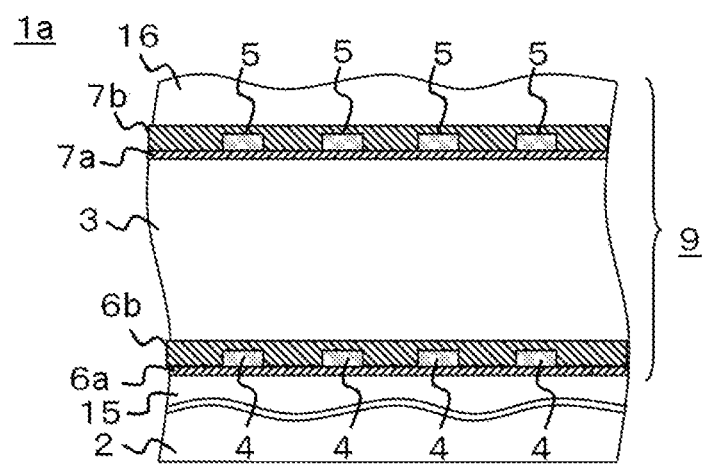

In FIG. 3D, the metal film 8b is etched to form the second coil 5. Then, the third insulating film 7b is formed between the coil portions of the adjacent turns of the second coil 5 and so as to cover the upper surface of the second coil 5. Specifically, the upper surface of the formed third insulating film 7b is polished by a CMP method to form the third insulating film 7b having a flat upper surface, and then the upper insulating film 16 is formed on the third insulating film 7b. Through the above steps, the signal transmission insulating device 1a shown in FIG. 2 can be obtained.

In Embodiment 1 of the present invention, owing to the above configuration, when a potential difference occurs between the first coil 4 and the second coil 5, electric field concentration occurs at a plurality of the corners of the first coil 4 and the second coil 5 in the signal transmission insulating device 1a having the thin film transformer structure 9. However, the second insulating films 6a and 6b and the third insulating films 7a and 7b, which have a lower resistivity than the first insulating film 3, are formed so as to surround the corners of the first coil 4 and the second coil 5, so that an electric field within the second insulating films 6a and 6b and the third insulating films 7a and 7b, which have a lower resistivity than the first insulating film 3, is allevi- ated. Therefore, since the respective corners of the first coil 4 and the second coil 5 at which the electric field concentration occurs are surrounded by the second insulating films 6a and 6b and the third insulating films 7a and 7b in which the electric field is alleviated, the electric field concentration at the corners is alleviated. As a result, since the electric field concentration is alleviated at both the first coil 4 side and the second coil 5 side, an insulation withstand voltage can be increased without increasing the thicknesses of the insulating films, that is, without increasing the distance between the first coil 4 and the second coil 5. Accordingly, it is possible to increase the insulation withstand voltage and also suppress a decrease in transmission characteristics such as a signal transmission speed or a signal transmission intensity.

In FIG. 1, in the signal transmission insulating device 1a according to Embodiment 1, the dielectric material having a lower resistivity than the dielectric material used for the first insulating film 3 is used for each of the second insulating films 6a and 6b and the third insulating films 7a and 7b. However, the combination of the first insulating film 3, the second insulating films 6a and 6b, and the third insulating films 7a and 7b is not limited to the $SiO_2$ film and the SiN films, and selection may be made as appropriate from dielectric materials such as $SiO_2$, SiN, polyimide, parylene, and the like such that the resistivity of the dielectric material used for each of the second insulating films 6a and 6b and the third insulating films 7a and 7b is lower than that of the dielectric material used for the first insulating film 3.

When an insulating material having a relatively low resistivity is used for each of the second insulating films 6a and 6b and the third insulating films 7a and 7b as in the present embodiment, there is a possibility that a function as a transformer is lost when the adjacent coil portions of the first coil 4 or the second coil 5, which constitutes the thin film transformer structure 9, are electrically short-circuited to each other via the second insulating films 6a and 6b or the third insulating films 7a and 7b. Thus, the resistivity of each of the second insulating films 6a and 6b and the third insulating films 7a and 7b is made equal to or higher than a resistivity with which electrical short-circuit is not caused between the adjacent coil portions of the first coil 4 or the second coil 5.

Figure 4A:
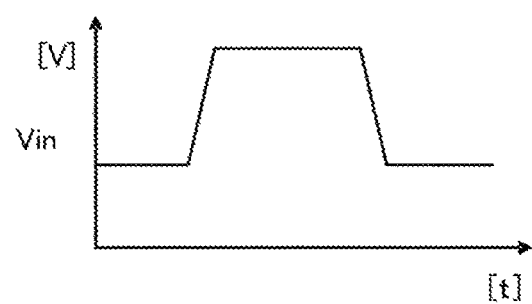
FIG. 4A, 4B are waveform diagrams showing an operating waveform of the signal transmission insulating device according to Embodiment 1 of the present invention.
Figure 4B:
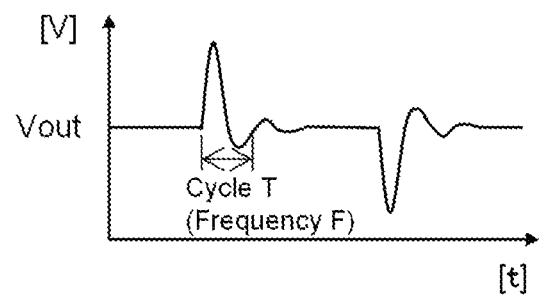

FIG. 4A, 4B show operating waveforms of the signal transmission insulating device 1a according to Embodiment 1. FIG. 4A shows an input square wave electrical signal, and FIG. 4B shows an output pulse electrical signal. In addition, the vertical axis indicates the voltage of each signal, and the horizontal axis indicates time. For example, as shown in FIG. 4A, a square wave electrical signal Vin is inputted to either one of the first coil 4 or the second coil 5, and a pulse electrical signal Vout with a frequency F is outputted to the other coil in response to rising and falling of the inputted square wave electrical signal Vin. In this case, when a period shown in FIG. 4B is T [sec] and frequency F=1/T a time constant τ [sec] between the adjacent coil portions of the first coil 4 or the second coil 5 needs to satisfy formula (1), in order that the adjacent coil portions are not electrically short-circuited to each other while the pulse electrical signal Vout is outputted.

$$\tau > 1/F \tag{1}$$

The time constant τ is obtained by formula (2), using a resistivity ρ [Ωm], a relative permittivity $\varepsilon_r$, and a vacuum permittivity $\varepsilon_0$ [F/m].

$$\tau = \rho \times \varepsilon_r \times \varepsilon_0 \tag{2}$$

On the basis of formula (1) and formula (2), the resistivity ρ each of the second insulating films 6a and 6b and the third insulating films 7a and 7b may be selected so as to satisfy formula (3).

$$\rho > 1/(F \times \varepsilon_r \times \varepsilon_0) \tag{3}$$

Since the second insulating film 6b and the third insulating film 7a are provided on the entireties of the lower surface and the upper surface of the first insulating film 3, respectively, deformation such as warpage of the first insulating film 3 can be effectively suppressed.

Each insulating film is desirably formed such that compressive stress occurs in the first insulating film 3 and tensile stress occurs in the second insulating film 6b and the third insulating film 7a, that is, such that stress that occurs in the first insulating film 3 and stress that occurs in the second insulating film 6b and the third insulating film 7a cancel each other. Accordingly, since the stress that occurs in the respective insulating films cancels each other, deformation of the semiconductor substrate 2 or each insulating film by warpage can be reduced. The stress that occurs in each respective insulating film is determined depending on complex conditions such as a temperature or a flow rate of gas when forming the insulating film, and the thickness of the insulating film. In laminating each film, these conditions may be adjusted while measuring stress, and the film may be produced. In addition, each film may be formed such that tensile stress occurs in the first insulating film 3 and compressive stress occurs in the second insulating film 6b and the third insulating film 7a.

In the present embodiment, each of the metal film 8a and the metal film 8b is formed by the sputtering deposition method. However, the method for forming each of the metal film 8a and the metal film 8b is not limited thereto, and each of the metal film 8a and the metal film 8b may be formed by using a thermal deposition method, an electron beam deposition method, or the like. In addition, the semiconductor substrate 2 is not limited to Si and may be another semiconductor substrate made of SiC or the like, and the metal film 8a and the metal film 8b are not limited to aluminum and another material such as Cu may be used therefor.

Figure 5:
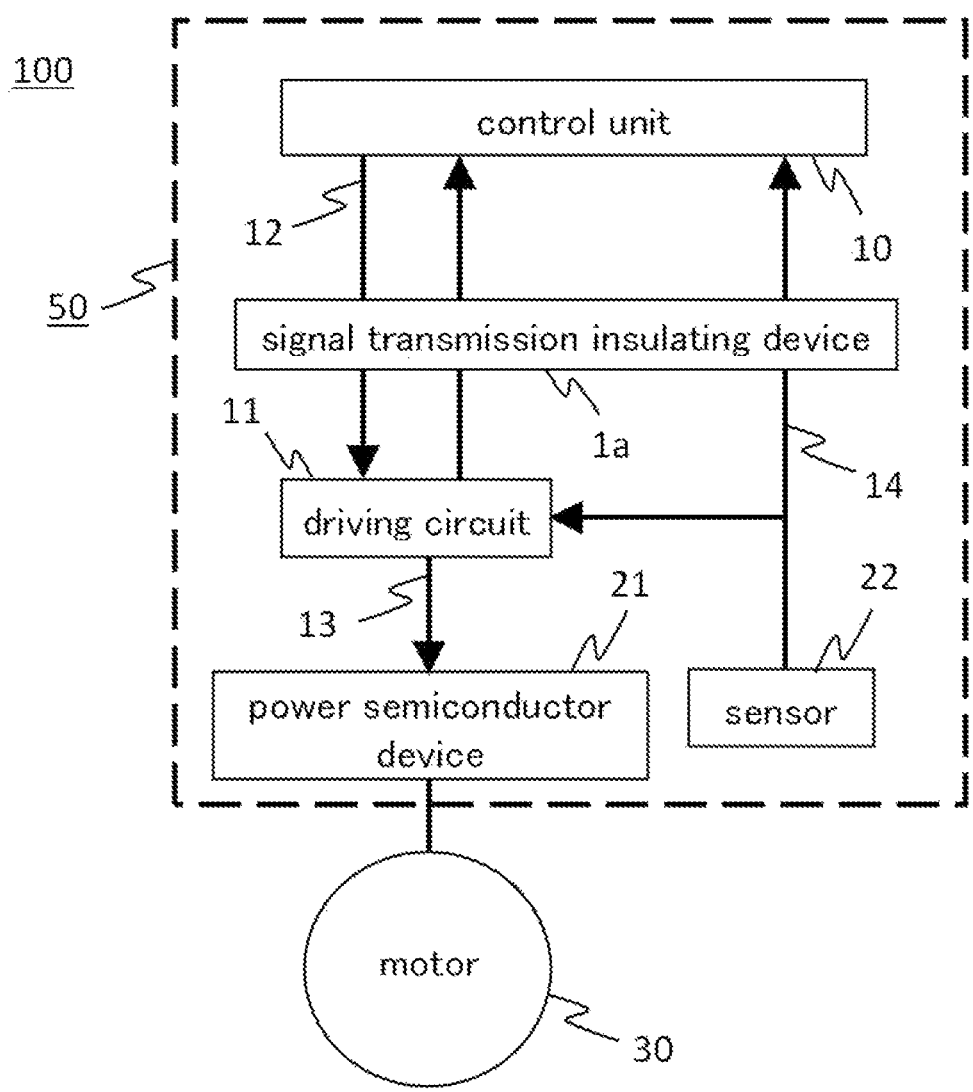
FIG. 5 is a block diagram showing a motor driving apparatus in which a power semiconductor module including the signal transmission insulating device according to Embodiment 1 of the present invention is used.

The signal transmission insulating device 1a according to Embodiment 1 of the present invention can be used in a power semiconductor module such as an IPM (Intelligent Power Module). Hereinafter, the case where a power semiconductor module including the signal transmission insulating device is according to Embodiment 1 of the present invention is used in a motor driving apparatus will be described. FIG. 5 is a block diagram showing a motor driving apparatus 100 in which a power semiconductor module 50 including the signal transmission insulating device 1a according to Embodiment 1 of the present invention is used.

In FIG. 5, the motor driving apparatus 100 includes the power semiconductor module 50 and a motor 30, and can drive the motor 30 by converting power outputted from a driving power source, which is not shown, with the power semiconductor module 50 as appropriate.

The power semiconductor module 50 includes a control unit 10 (also referred to as "control circuit"), the signal transmission insulating device is, a driving circuit 11, a power semiconductor device 21, and a sensor 22. The driving circuit 11 operates in response to a control signal 12 inputted from the control unit 10 through the signal transmission insulating device 1a, and outputs a driving signal 13 to the power semiconductor device 21. The power semiconductor device 21 is a semiconductor device such as an IGBT or a MOSFET, and performs switching operation on the basis of the driving signal 13. Meanwhile, the sensor 22 measures a chip temperature of the power semiconductor device 21 or a current flowing through the power semiconductor device 21, and outputs a sensor signal 14 to the driving circuit 11 and the control unit 10. The control unit 10 outputs the control signal 12 to the driving circuit 11 on the basis of the sensor signal 14 inputted from the sensor 22 through the signal transmission insulating device 1a, etc., to control the power semiconductor device 21. By the control unit 10 controlling operation of the power semiconductor device 21, predetermined power conversion as an inverter circuit can be performed to drive the motor 30. The signal input/output between the control unit 10 and the driving circuit 11 or the sensor 22 is performed via the signal transmission insulating device 1a provided in the power semiconductor module 50.

When the sensor 22 measures an overcurrent to the power semiconductor device 21 or measures that the chip temperature of the power semiconductor device 21 has risen to a predetermined value or higher, the driving circuit 11 stops the output of the driving signal 13 to the power semiconductor device 21 to protect the power semiconductor device 21. With such a configuration, it is made possible to protect the power semiconductor device 21 by the driving circuit 11 and the sensor 22 provided in the power semiconductor module 50. Thus, the power semiconductor module 50 has a protection function and hence is highly functionalized.

Here, a signal having a relatively low voltage among the motor driving apparatus 100 flows in the control unit 10 side, and thus the control unit 10 has a lower potential among the motor driving apparatus 100. Meanwhile, a signal having a relatively high voltage among the motor driving apparatus 100 flows in a main circuit of an inverter circuit such as the driving circuit 11 or the power semiconductor device 21, and thus the main circuit of the inverter circuit such as the driving circuit 11 or the power semiconductor device 21 has a higher potential among the motor driving apparatus 100. As a result, a potential difference of several hundred to several thousand volts may occur between the control unit 10 and the main circuit of the inverter circuit such as the driving circuit 11 or the power semiconductor device 21, and an element of the control unit 10 may be broken when a current flows from the main circuit of the inverter circuit such as the driving circuit 11 or the power semiconductor device 21 to the control unit 10 due to this potential difference.

Therefore, as shown in FIG. 5, signal transmission between the control unit 10 and the main circuit of the inverter circuit such as the driving circuit 11 or the power semiconductor device 21 is performed via the signal transmission insulating device 1a, whereby it is possible to keep the control unit 10 and the main circuit of the inverter circuit such as the driving circuit 11 or the power semiconductor device 21 insulated from each other and also transmit the sensor signal 14 and the control signal 12 therebetween.

As described above, the signal transmission insulating device 1a can increase the insulation withstand voltage and also can suppress a decrease in signal transmission characteristics. Thus, when a predetermined insulation withstand voltage is set, the signal transmission insulating device 1a have higher transmission characteristics such a signal transmission speed or a signal transmission intensity than another signal transmission insulating device. Thus, by applying the signal transmission insulating device 1a according to Embodiment 1 to the power semiconductor module 50, it is possible to maintain insulation between the control unit 10 and the main circuit of the inverter circuit such as the driving circuit 11 or the power semiconductor device 21 and also improve the transmission characteristics for the control signal 12 or the sensor signal 14 therebetween. Owing to the improvement of the transmission characteristics, control delay or the like is reduced, so that the power semiconductor device 21 can be operated at a higher speed. As a result, the power semiconductor module 50 becomes a power semiconductor module that does not impair safety against insulation breakdown and is capable of high-speed response and the like, that is, a power semiconductor module having high quality and high safety.

In the present embodiment, the power semiconductor module 50 having the protection function is configured by providing the sensor 22 within the power semiconductor module 50. However, the power semiconductor module 50 is not limited thereto and may be a power semiconductor module that is not provided with a sensor and does not have a protection function. Even in such a case, since the power semiconductor module includes the signal transmission insulating device 1a, the power semiconductor module is able to insulate the driving circuit and the control unit from each other, and is also able to improve the transmission characteristics for the control signal 12 or the like, thereby enabling high-speed operation or the like.

Embodiment 2

The configuration of the present invention is not limited to the configuration of the signal transmission insulating device 1a according to Embodiment 1 and may be another configuration. In particular, when the semiconductor substrate 2 is electrically conductive and the first coil 4 and the semiconductor substrate 2 are grounded, occurrence of electric field concentration at each corner of the first coil 4 which corner faces the semiconductor substrate 2 is suppressed. Thus, the second insulating film 6a, which is provided below the first coil 4, can be omitted to reduce the number of steps during manufacture, so that the production cost can be reduced. Now, a configuration different from the signal transmission insulating device 1a according to Embodiment 1 will be described. In the following, a portion of the second insulating film different from Embodiment 1 of the present invention will be described, and the description of the other portion which is the same as or corresponds to that of Embodiment 1 of the present invention is omitted.

Figure 6:
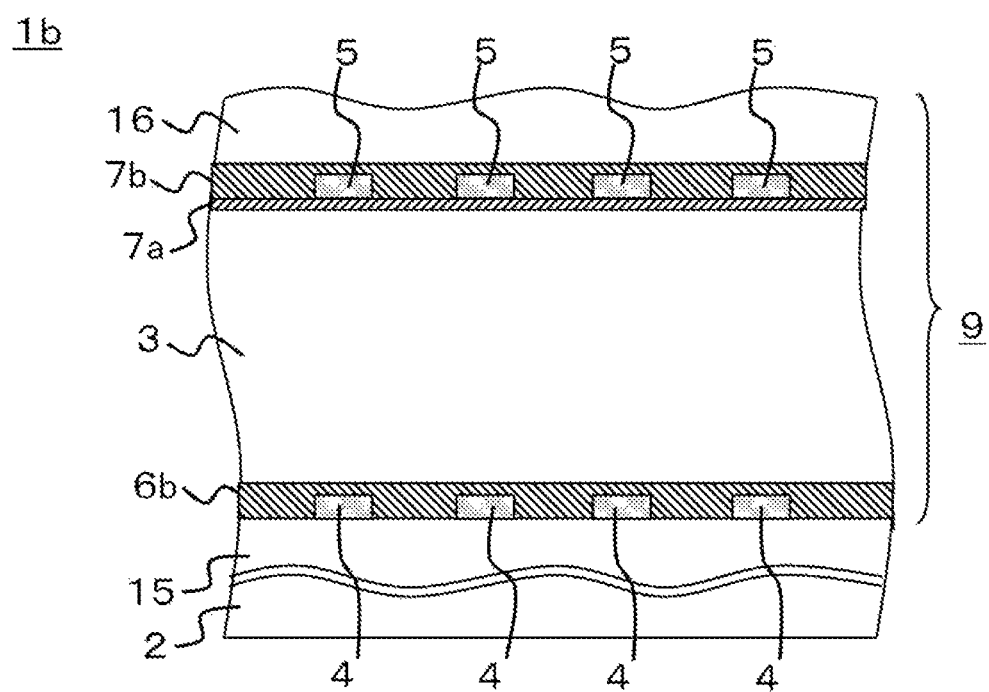
FIG. 6 is a cross-sectional view showing the configuration of a signal transmission insulating device according to Embodiment 2 of the present invention.

First, the configuration of a signal transmission insulating device 1b according to Embodiment 2 will be described. FIG. 6 is a cross-sectional view showing the configuration of the signal transmission insulating device 1b according to Embodiment 2 of the present invention. In FIG. 6, the components designated by the same reference characters as in FIG. 2 are components that are the same as or correspond to those in FIG. 2, and the description thereof is omitted.

In FIG. 6, the signal transmission insulating device 1b according to Embodiment 2 is different from the signal transmission insulating device 1a according to Embodiment 1, in that the second insulating film 6a is omitted. The first coil 4 is disposed on the lower insulating film 15, and the second insulating film 6b is provided between the respective coil portions of the adjacent turns and on the surface of the first coil 4 which surface faces the second coil 5, so as to surround the corners of the first coil 4 which corners face the second coil 5.

Here, each space between the coil portions of the adjacent turns of the first coil 4 is filled with the second insulating film 6b, and the upper surface of the second insulating film 6b is formed to be flat, whereby it is possible to enhance the effect of alleviating electric field concentration at each corner of the first coil 4. In addition, each space between the coil portions of the adjacent turns of the second coil 5 is filled with the third insulating film 7b, and the lower surface of the third insulating film 7a and the upper surface of the third insulating film 7b are formed to be flat, whereby it is possible to enhance the effect of alleviating electric field concentration at each corner of the second coil 5.

By forming the films to be flat as described above, it is possible to disperse mechanical stress generated and applied to each film due to the differences in firm stress or coefficient of thermal expansion between the second insulating film 6b and the first insulating film 3, between the third insulating film 7a and the first insulating film 3, and between the third insulating film 7b and the upper insulating film 16. Thus, it is possible to suppress occurrence of a crack or the like to improve the reliability of insulation.

Next, a manufacturing method for the signal transmission insulating device 1b according to Embodiment 2 of the present invention will be described. FIG. 7A, 7B, 7C, 7D are cross-sectional views showing a manufacturing flow for the signal transmission insulating device 1b according to Embodiment 2 of the present invention.

Figure 7A:
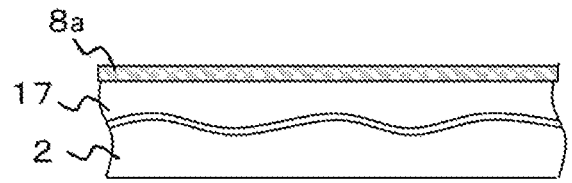
FIG. 7A, 7B, 7C, 7D are cross-sectional views showing a manufacturing flow for the signal transmission insulating device according to Embodiment 2 of the present invention.

In FIG. 7A, the lower insulating film 15 is formed by a CVD method on the semiconductor substrate 2 made of Si or the like. Then, the metal film 8a made of aluminum or the like is formed on the lower insulating film 15 by a sputtering deposition method.

Figure 7B:
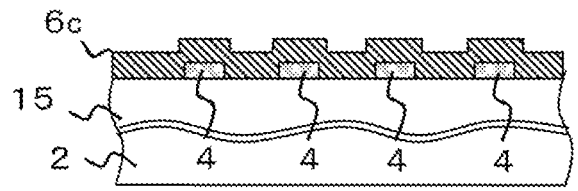

In FIG. 7B, the metal film 8a is etched to form the first coil 4. Then, the insulating film 6c which is to be the second insulating film 6b is formed by a CVD method between the respective coil portions of the adjacent turns of the first coil 4 and on the surface of the first coil 4 which surface faces the second coil 5, so as to surround the corners of the first coil 4 which corners face the second coil 5.

Figure 7C:
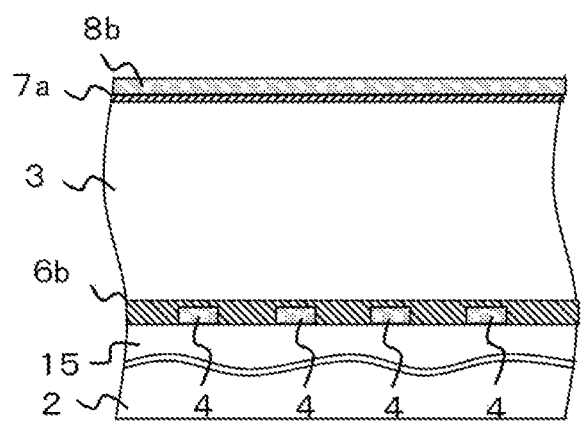

In FIG. 7C, the upper surface of the second insulating film 6c is polished to be flat by a CMP method to form the second insulating film 6b, and the first insulating film 3 having a flat upper surface is formed on the second insulating film 6b. Furthermore, the third insulating film 7a is formed on the first insulating film 3. Thereafter, the metal film 8b is formed on the third insulating film 7a by a sputtering deposition method.

Figure 7D:
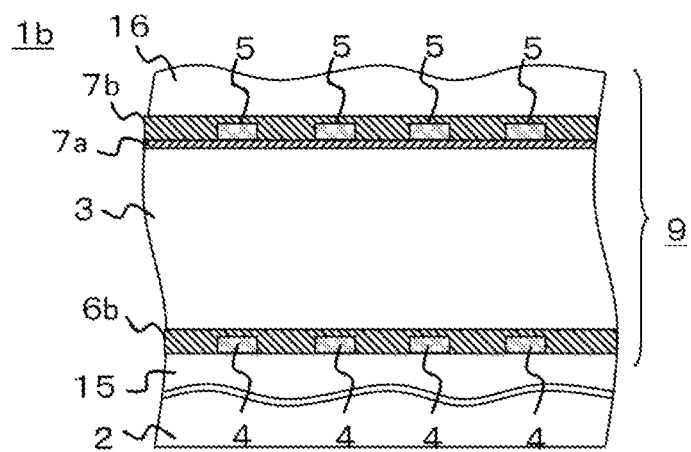

In FIG. 7D, the metal film 8b is etched to form the second coil 5. Then, a third insulating film is formed between the coil portions of the adjacent turns of the second coil 5 and on the upper surface of the second coil 5 so as to surround the second coil 5, and is polished by a CMP method to form the third insulating film 7b having a flat upper surface, and the upper insulating film 16 is formed on the third insulating film 7b.

In Embodiment 2, owing to the above configuration, when a potential difference occurs between the first coil 4 and the second coil 5, electric field concentration occurs at a plurality of the corners of the first coil 4 and the second coil 5 in the signal transmission insulating device 1b having the thin film transformer structure 9. However, the second insulating film 6b and the third insulating films 7a and 7b, which have a lower resistivity than the first insulating film 3, are formed so as to surround the corners of the first coil 4 and the second coil 5, so that an electric field within the second insulating film 6b and the third insulating films 7a and 7b, which have a lower resistivity than the first insulating film 3, is alleviated. In addition, when the semiconductor substrate 2 is electrically conductive and the first coil 4 and the semiconductor substrate 2 are grounded, an electric field at the corners of the first coil 4 which corners face the semiconductor substrate 2 is also alleviated. Therefore, since the respective corners of the first coil 4 and the second coil 5 at which the electric field concentration occurs are surrounded by the second insulating film 6b and the third insulating films 7a and 7b in which the electric field is alleviated, the electric field concentration at the corners is alleviated. As a result, since the electric field concentration is alleviated at both the first coil 4 side and the second coil 5 side, an insulation withstand voltage can be increased without increasing the thicknesses of the insulating films, that is, without increasing the distance between the first coil 4 and the second coil 5. Accordingly, it is possible to increase the insulation withstand voltage and also suppress a decrease in transmission characteristics such as a signal transmission speed or a signal transmission intensity.

As compared to the signal transmission insulating device 1a according to Embodiment 1, production of the second insulating film 6a becomes unnecessary, so that the number of steps during manufacture can be reduced and thus the production cost can be reduced.

Similarly to Embodiment 1, by applying the signal transmission insulating device 1b according to Embodiment 2 to a power semiconductor module, a power semiconductor module having high quality and high safety can be provided.

In Embodiment 2 of the present invention, the portion different from Embodiment 1 of the present invention has been described, and the description of the portions that are the same as or correspond to those of Embodiment 1 of the present invention has been omitted.

Embodiment 3

Figure 8:
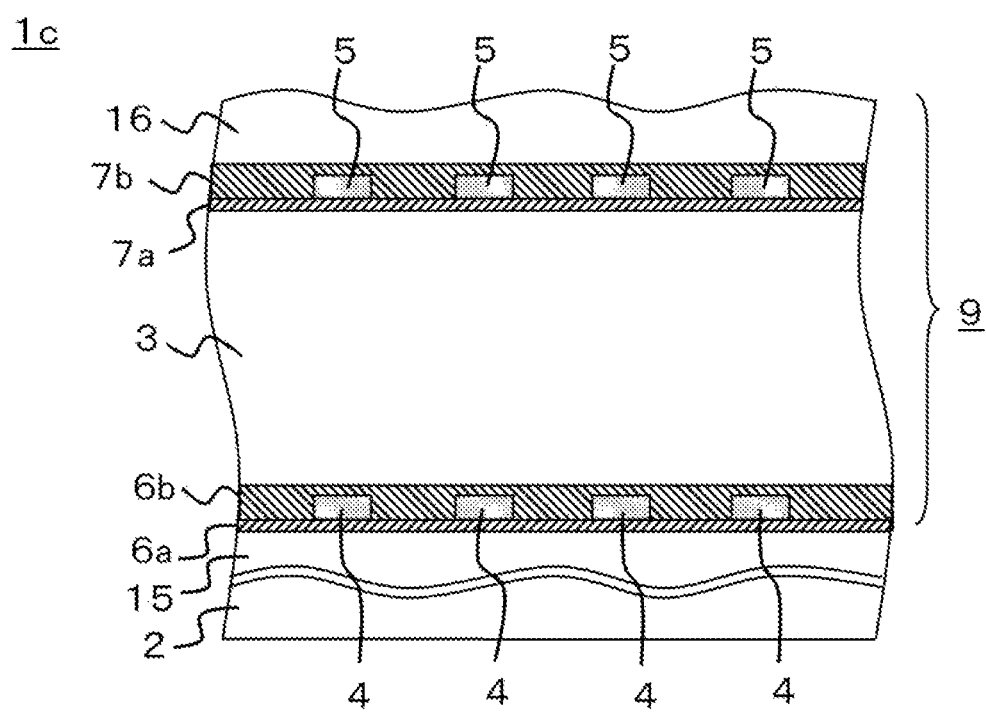
FIG. 8 is a cross-sectional view showing the configuration of a signal transmission insulating device according to Embodiment 3 of the present invention.

The configuration of a signal transmission insulating device 1c according to Embodiment 3 will be described. FIG. 8 is a cross-sectional view showing the configuration of the signal transmission insulating device 1c according to Embodiment 3 of the present invention. In FIG. 8, the components designated by the same reference characters as in FIG. 2 are components that are the same as or correspond to those in FIG. 2. In addition, the present embodiment is different from Embodiment 1 in the configurations of the second insulating films 6a and 6b and the third insulating films 7a and 7b, and thus in the following, only this difference will be described and the description of the other configuration is omitted.

In FIG. 8, in the signal transmission insulating device 1c according to Embodiment 3, a dielectric material having a higher permittivity than the dielectric material used for the first insulating film 3 is used for each of the second insulating films 6a and 6b and the third insulating films 7a and 7b. For example, when an SiO$_2$ film is used as the first insulating film 3, an SiN film may be used as each of the second insulating films 6a and 6b and the third insulating films 7a and 7b. The combination of the first insulating film 3, the second insulating films 6a and 6b, and the third insulating films 7a and 7b is not limited to the SiO$_2$ film and the SiN films, and selection may be made as appropriate from dielectric materials such as SiO$_2$, SiN, polyimide, parylene, and the like such that the permittivity of the dielectric material used for each of the second insulating films 6a and 6b and the third insulating films 7a and 7b is higher than that of the dielectric material used for the first insulating film 3.

A manufacturing method for the signal transmission insulating device 1c according to Embodiment 3 of the present invention is the same as the manufacturing method for the signal transmission insulating device 1a according to Embodiment 1.

In Embodiment 3, owing to the above configuration, when a potential difference occurs between the first coil 4 and the second coil 5, electric field concentration occurs at a plurality of the corners of the first coil 4 and the second coil 5 in the signal transmission insulating device 1c having the thin film transformer structure 9. However, the second insulating films 6a and 6b and the third insulating films 7a and 7b, which have a higher permittivity than the first insulating film 3, are formed so as to surround the corners of the first coil 4 and the second coil 5, so that an electric field within the second insulating films 6a and 6b and the third insulating films 7a and 7b, which have a higher permittivity than the first insulating film 3, is alleviated. Therefore, since the respective corners of the first coil 4 and the second coil 5 at which the electric field concentration occurs are surrounded by the second insulating films 6a and 6b and the third insulating films 7a and 7b in which the electric field is alleviated, the electric field concentration at the corners is alleviated. As a result, since the electric field concentration is alleviated at both the first coil 4 side and the second coil 5 side, an insulation withstand voltage can be increased without increasing the thicknesses of the insulating films, that is, without increasing the distance between the first coil 4 and the second coil 5. Accordingly, it is possible to increase the insulation withstand voltage and also suppress a decrease in transmission characteristics such as a signal transmission speed or a signal transmission intensity.

Similarly to Embodiments 1 and 2, by applying the signal transmission insulating device 1c according to Embodiment 3 to a power semiconductor module, a power semiconductor module having high quality and high safety can be provided.

Embodiment 4

Figure 9:
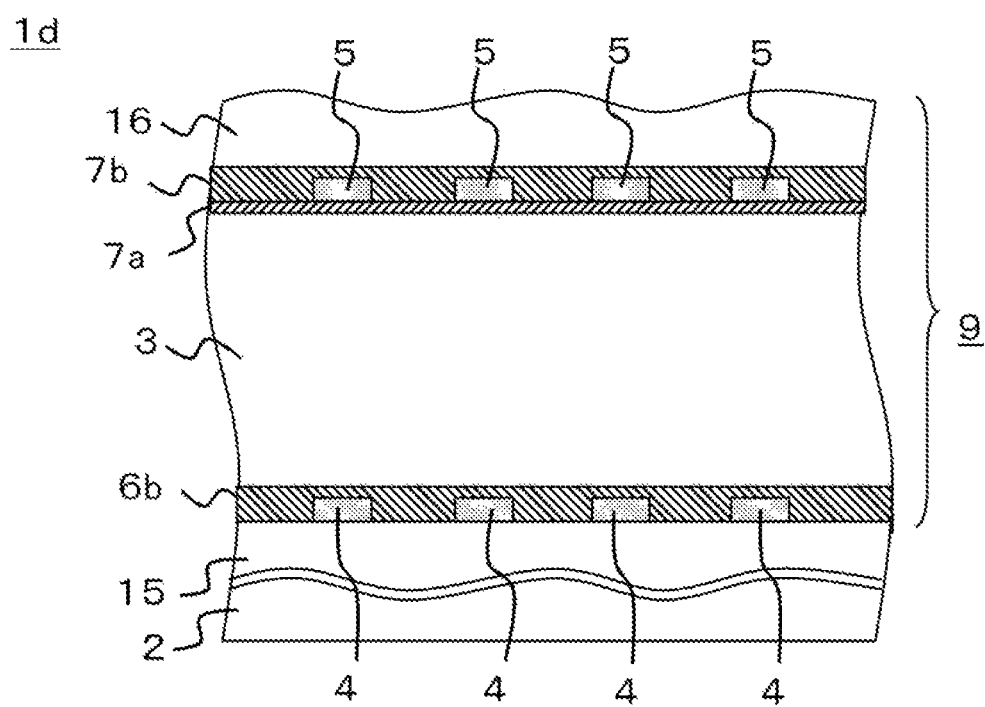
FIG. 9 is a cross-sectional view showing the configuration of a signal transmission insulating device according to Embodiment 4 of the present invention.

The configuration of a signal transmission insulating device 1d according to Embodiment 4 will be described. FIG. 9 is a cross-sectional view showing the configuration of the signal transmission insulating device 1d according to Embodiment 4 of the present invention. In FIG. 9, the components designated by the same reference characters as in FIG. 6 are components that are the same as or correspond to those in FIG. 6. In addition, the present embodiment is different from Embodiment 2 in the configurations of the second insulating film 6b and the third insulating films 7a and 7b, and thus in the following, only this difference will be described and the description of the other configuration is omitted.

In FIG. 9, in the signal transmission insulating device 1d according to Embodiment 4, a dielectric material having a higher permittivity than the dielectric material used for the first insulating film 3 is used for each of the second insulating film 6b and the third insulating films 7a and 7b. For example, when an SiO$_2$ film is used as the first insulating film 3, an SiN film may be used as each of the second insulating film 6b and the third insulating films 7a and 7b. The combination of the first insulating film 3, the second insulating film 6b, and the third insulating films 7a and 7b is not limited to the SiO$_2$ film and the SiN films, and selection may be made as appropriate from dielectric materials such as SiC$_2$, SiN, polyimide, parylene, and the like such that the permittivity of the dielectric material used for each of the second insulating film 6b and the third insulating films 7a and 7b is higher than that of the dielectric material used for the first insulating film 3.

A manufacturing method for the signal transmission insulating device 1d according to Embodiment 4 of the present invention is the same as the manufacturing method for the signal transmission insulating device 1b according to Embodiment 2.

In Embodiment 4, owing to the above configuration, when a potential difference occurs between the first coil 4 and the second coil 5, electric field concentration occurs at a plurality of the corners of the first coil 4 and the second coil 5 in the signal transmission insulating device 1d having the thin film transformer structure 9. However, the second insulating film 6b and the third insulating films 7a and 7b, which have a higher permittivity than the first insulating film 3, are formed so as to surround the first coil 4 and the second coil 5, so that an electric field within the second insulating film 6b and the third insulating films 7a and 7b, which have a higher permittivity than the first insulating film 3, is alleviated. In addition, when the semiconductor substrate 2 is electrically conductive and the first coil 4 and the semiconductor substrate 2 are grounded, an electric field at the corners of the first coil 4 which corners face the semiconductor substrate 2 is also alleviated. Therefore, since the respective corners of the first coil 4 and the second coil 5 at which the electric field concentration occurs are surrounded by the second insulating film 6b and the third insulating films 7a and 7b in which the electric field is alleviated, the electric field concentration at the corners is alleviated. As a result, since the electric field concentration is alleviated at both the first coil 4 side and the second coil 5 side, an insulation withstand voltage can be increased without increasing the thicknesses of the insulating films, that is, without increasing the distance between the first coil 4 and the second coil 5. Accordingly, it is possible to increase the insulation withstand voltage and also suppress a decrease in transmission characteristics such as a signal transmission speed or a signal transmission intensity.

As compared to the signal transmission insulating device 1a or 1c according to Embodiment 1 or 3, production of the second insulating film 6a becomes unnecessary, so that the number of steps during manufacture can be reduced and thus the production cost can be reduced.

Similarly to Embodiments 1 to 3, by applying the signal transmission insulating device 1d according to Embodiment 4 to a power semiconductor module, a power semiconductor module having high quality and high safety can be provided.

It is noted that, within the scope of the present invention, the above embodiments may be freely combined with each other, or each of the above embodiments may be modified or abbreviated as appropriate.

DESCRIPTION OF THE REFERENCE CHARACTERS 1a, 1b, 1c, 1d signal transmission insulating device
2 semiconductor substrate
3 first insulating film
4 first coil
5 second coil
6a, 6b, 6c second insulating film
7a, 7b third insulating film
8a, 8b metal film
9 thin film transformer structure
10 control unit
11 driving circuit
12 control signal
13 driving signal
14 sensor signal
15 lower insulating film
16 upper insulating film
17 insulating film
21 power semiconductor device
22 sensor
30 motor
50 power semiconductor module
100 motor driving apparatus

The invention claimed is:

1. A signal transmission insulating device comprising:
a first coil;
a second coil opposing the first coil to form a transformer together with the first coil;
a first insulating film provided between the opposing first coil and second coil and made of a first dielectric material;
a second insulating film including a first film provided between the first insulating film and a surface in contact with a second principal surface of the first coil opposite to a first principal surface of the first coil which first principal surface faces the second coil, the first film filling and covering the first coil, the second insulating film including a second film provided on the surface in contact with the second principal surface and adjacently to the first film, the second insulating film being made of a second dielectric material having a lower resistivity than the first dielectric material; and
a third insulating film including a third film provided between the first insulating film and a surface in contact with a third principal surface of the second coil which third principal surface faces the first coil, and a fourth film provided on the surface in contact with the third principal surface and adjacently to the third film, the fourth film filling and covering the second coil, the third insulating film being made of a third dielectric material having a lower resistivity than the first dielectric material.

2. A signal transmission insulating device comprising:
a first coil;
a second coil opposing the first coil to form a transformer together with the first coil;
a first insulating film provided between the opposing first coil and second coil and made of a first dielectric material;
a second insulating film including a first film provided between the first insulating film and a surface in contact with a second principal surface of the first coil opposite to a first principal surface of the first coil which first principal surface faces the second coil, the first film filling and covering the first coil, the second insulating film including a second film provided on the surface in contact with the second principal surface and adjacently to the first film, the second insulating film being made of a second dielectric material having a higher permittivity than the first dielectric material; and
a third insulating film including a third film provided between the first insulating film and a surface in contact with a third principal surface of the second coil which third principal surface faces the first coil, and a fourth film provided on the surface in contact with the third principal surface and adjacently to the third film, the fourth film filling and covering the second coil, the third insulating film being made of a third dielectric material having a higher permittivity than the first dielectric material.

3. A signal transmission insulating device comprising:
a first coil;

a second coil opposing the first coil to form a transformer together with the first coil;

a first insulating film provided between the opposing first coil and second coil and made of a first dielectric material;

a second insulating film including a first film provided between the first insulating film and a surface in contact with a second principal surface of the first coil opposite to a first principal surface of the first coil which first principal surface faces the second coil, the first film filling and covering the first coil, the second insulating film including a second film provided on the surface in contact with the second principal surface and adjacently to the first film, the second insulating film being made of a second dielectric material having a lower resistivity than the first dielectric material; and a third insulating film including a third film provided between the first insulating film and a surface in contact with a third principal surface of the second coil which third principal surface faces the first coil, and a fourth film provided on the surface in contact with the third principal surface and adjacently to the third film, the fourth film filling and covering the second coil, the third insulating film being made of a third dielectric material having a lower resistivity than the first dielectric material, wherein a surface, at the first insulating film side, of the first film which surface is adjacent to the first insulating film is formed to be flat, and a surface of the fourth film which surface is opposite to a surface of the fourth film which surface is in contact with the third film is formed to be flat.

4. A signal transmission insulating device comprising:

a first coil;

a second coil opposing the first coil to form a transformer together with the first coil;

a first insulating film provided between the opposing first coil and second coil and made of a first dielectric material;

a second insulating film including a first film provided between the first insulating film and a surface in contact with a second principal surface of the first coil opposite to a first principal surface of the first coil which first principal surface faces the second coil, the first film filling and covering the first coil, the second insulating film including a second film provided on the surface in contact with the second principal surface and adjacently to the first film, the second insulating film being made of a second dielectric material having a higher permittivity than the first dielectric material; and a third insulating film including a third film provided between the first insulating film and a surface in contact with a third principal surface of the second coil which third principal surface faces the first coil, and a fourth film provided on the surface in contact with the third principal surface and adjacently to the third film, the fourth film filling and covering the second coil, the third insulating film being made of a third dielectric material having a higher permittivity than the first dielectric material, wherein a surface, at the first insulating film side, of the first film which surface is adjacent to the first insulating film is formed to be flat, and a surface of the fourth film which surface is opposite to a surface of the fourth film which surface is in contact with the third film is formed to be flat.

5. The signal transmission insulating device according to claim 1, wherein the second film provided in a portion in contact with the second principal surface of the first coil opposite to the first principal surface facing the second coil is omitted.

6. The signal transmission insulating device according to claim 1, wherein the first insulating film in which compressive stress occurs, and the second insulating film and the third insulating film in which tensile stress occurs, are provided.

7. The signal transmission insulating device according to claim 1, wherein the first insulating film in which tensile stress occurs, and the second insulating film and the third insulating film in which compressive stress occurs, are provided.

8. The signal transmission insulating device according to claim 1, wherein the first dielectric material is $SiO_2$.

9. The signal transmission insulating device according to claim 1, wherein the second dielectric material is SiN.

10. The signal transmission insulating device according to claim 1, wherein the third dielectric material is SiN.

11. A power semiconductor module comprising:

a power semiconductor device;

a driving circuit for driving the power semiconductor device; and the signal transmission insulating device according to claim 1, for transmitting a signal between the driving circuit and a control circuit for controlling the power semiconductor device, and insulating the driving circuit and the control circuit from each other.

* * * * *